United States Patent [19]

Komoda

[11] Patent Number: 5,101,178

[45] Date of Patent: Mar. 31, 1992

[54] CRYSTAL OSCILLATOR HAVING FREQUENCY ADJUSTMENT RESPONSIVE TO POWER SUPPLY VOLTAGE

[75] Inventor: Motoyoshi Komoda, Tokyo, Japan

[73] Assignee: NEC Corporation, Tokyo, Japan

[21] Appl. No.: 674,992

[22] Filed: Mar. 26, 1991

[30] Foreign Application Priority Data

Mar. 27, 1990 [JP] Japan .................................. 2-78019

[51] Int. Cl.$^5$ ............................................. H03L 1/00
[52] U.S. Cl. .................................. 331/158; 331/175; 331/185
[58] Field of Search ............. 331/175, 116 R, 116 FE, 331/158, 185

[56] References Cited

U.S. PATENT DOCUMENTS 4,179,671 12/1979 Yoshida et al. ............... 331/116 FE Primary Examiner—Siegfried H. Grimm
Attorney, Agent, or Firm—Sughrue, Mion, Zinn, Macpeak & Seas

[57] ABSTRACT

Frequency compensation for a crystal oscillator circuit whose oscillation frequency is dependent on source voltage applied thereto. When a capacitor is added to the frequency compensation terminal of the crystal oscillator circuit, the circuit changes the oscillation frequency thereof on the basis of the capacitance of the capacitor. A source voltage detector compares the source voltage being applied to the crystal oscillator circuit with a predetermined reference voltage and produces a control signal matching whether the source voltage is higher or lower than the reference voltage. On receiving the control signal, a control switch turns on or off the contact thereof to add or not to add the capacitor to the frequency compensation terminal. Assuming that the characteristic of the crystal oscillator circuit is such that the oscillating frequency decreases with the decrease in the source voltage, when the source voltage is low, the capacitor for frequency compensation is not added so as to increase the oscillation frequency of the crystal oscillator. Conversely, when the characteristic is such that the oscillation frequency increases with the decrease in the source voltage, the capacitor is added so as to decrease the oscillation frequency.

23 Claims, 3 Drawing Sheets

CRYSTAL OSCILLATOR HAVING FREQUENCY ADJUSTMENT RESPONSIVE TO POWER SUPPLY VOLTAGE

BACKGROUND OF THE INVENTION

The present invention relates to a crystal oscillator and, more particularly, to a crystal oscillator for generating a reference clock signal which clocks a timepiece included in a battery-powered portable apparatus.

A battery-powered portable telephone or similar portable apparatus is often provided with a timepiece function for user's convenience. Circuits for the timepiece function are mounted on a one-chip integrated circuit (IC), for a miniature and inexpensive configuration. Preferably, a portable apparatus should be so constructed as to turn off its power source when the expected function thereof is not effective, thereby promoting battery saving. The timepiece, however, does not function correctly unless it is powered at all times. To insure accurate operations, the timepiece is usually clocked by a reference clock signal which is generated by a crystal oscillator. It follows that reducing the current to be consumed by the crystal oscillator is decisive in reducing the current consumption of the entire portable apparatus. More specifically, reducing the current consumption of the crystal oscillator is successful in enhancing battery saving. In light of this, it is a common practice to drive the crystal oscillator by a comparatively low voltage when the portable apparatus is not serving the expected function.

However, the problem is that the oscillation frequency of the crystal oscillator changes with the drive, or source, voltage. Should the source voltage be lowered for the battery saving purpose, the oscillation frequency of the crystal oscillator would be changed to prevent the timepiece from achieving sufficient accuracy.

SUMMARY OF THE INVENTION

An object of the present invention is, therefore, to provide a generally-improved crystal oscillator device for use in a timepiece of a battery-powered portable apparatus.

Another object of the present invention is to provide a crystal oscillator device whose change in oscillation frequency ascribable to a change in a source voltage is compensated for.

A crystal oscillator device of the present invention includes a source terminal to which power of different voltages may be applied, and a crystal oscillator circuit connected to the source terminal and whose oscillation frequency is dependent on the source voltage. The crystal oscillator also includes a capacitor for frequency compensation and a control switch for selectively adding or not adding the capacitor to the crystal oscillator circuit. The crystal oscillator circuit changes the frequency thereof on the basis of the capacitance of the capacitor when the latter is added thereto. Connected to the control switch, a source voltage detector compares the source voltage being applied to the crystal oscillator circuit with a predetermined reference voltage and produces a control signal on the basis of whether the source voltage is higher or lower than the reference voltage. In response to the control signal, the control switch is turned on or off to add or not to add the capacitor to the crystal oscillator circuit. Assuming that the crystal oscillator circuit has such a characteristic that the oscillation frequency decreases with the decrease in source voltage, when the source voltage is low, the capacitor is not added to the crystal oscillator circuit so as to increase the oscillation frequency of the crystal oscillator. Conversely, when the characteristic is such that the oscillation frequency increases with the decrease in source voltage, when the source voltage is low, the capacitor is added to the crystal oscillator circuit to lower the oscillation frequency of the crystal oscillator.

BRIEF DESCRIPTION OF THE DRAWINGS

The above-mentioned and other objects, features and advantages of the present invention will become more apparent by reference to the following detailed description of the invention taken in conjunction with the accompanying drawings, wherein.

DETAILED DESCRIPTION OF THE PREFERRED EMBODIMENTS

Figure 1:
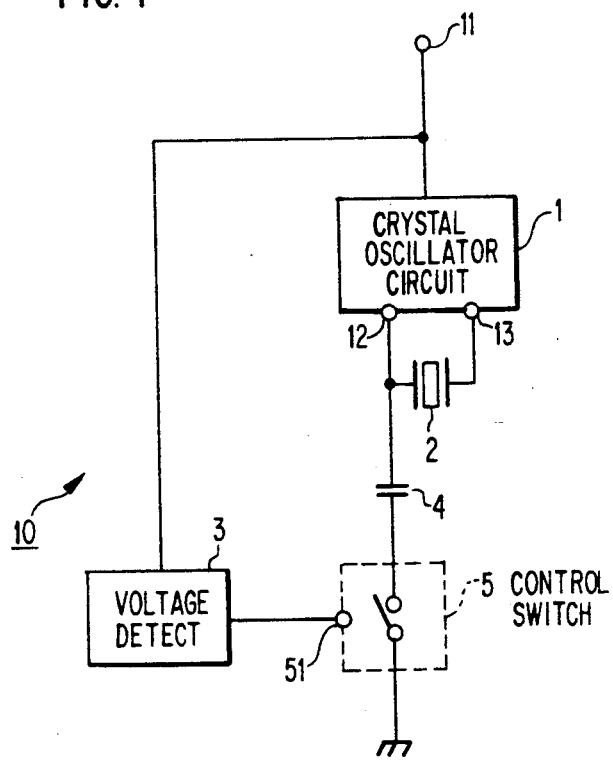
FIG. 1 is a block diagram showing a crystal oscillator device embodying the present invention.

Referring to FIG. 1, a crystal oscillator device 10 includes a crystal oscillator circuit 1 having terminals 12 and 13 connected to opposite ends of a crystal 2. The crystal oscillator circuit 1 may be included in a one-chip microprocessor, for example, in $\mu$PD75008 manufactured and marketed by NEC Corporation, the present assignee. To better understand the present invention, the mode-by-mode current consumption of $\mu$PD75008 which is applicable to a portable telephone will first be described. This IC has a portable telephone function, a timepiece function and other similar functions. The major component of the IC is a central processing unit (CPU) which needs a source voltage of 5 volts (V) and executes control by digital signals. To implement the timepiece function, the IC has an active circuit assigned to the crystal oscillator device 10. A portable telephone is operable in any one of three different modes, i.e., an operation mode which is used for only a short period of time, a standby mode used for several milliseconds within 0.5 seconds, and a timepiece mode used at all times. In the operation mode and standby mode, the IC has to interchange data with other CPUs and, therefore, needs the source voltage of 5 V. In the timepiece mode, a source voltage simply high enough to drive the crystal oscillator circuit, e.g. 3 V, suffices since the IC does not have to interchange data with other CPUs. Regarding the necessary voltage and current, the operation mode needs 5 V and 2.5 mA while the standby mode needs 5 V and 90 $\mu$A. In the case of the timepiece mode, a current of 25 $\mu$A is needed when a 5-V power source is used, but only 5.5 $\mu$A suffices when use is made of a 3-V power source. As these data indicate, using the 3-V power source during the timepiece mode which occupies major part of the operation time of the apparatus contributes a great deal to battery saving.

However, simply changing the source voltage of the crystal oscillator circuit results in the inaccurate operation of the timepiece, because the oscillation frequency of the crystal oscillator circuit 1 is dependent on the source voltage. In the following description, let it be assumed that the oscillation frequency of the circuit 1 increases with the increase in the voltage being applied to a source terminal 11 by way of example. A source voltage detector 3 compares the source voltage being applied to the circuit 1 with a predetermined reference voltage. The source voltage detector 3 generates a first control signal when the source voltage is higher than the reference voltage or a second control signal when the source voltage is lower than the reference voltage. A capacitor 4 is connected at one end to the terminal 12, or frequency control terminal, of the crystal oscillator circuit 1 and at the other end to one end of a control switch 5. The other end of the control switch 5 is connected to ground.

The first control signal from the source voltage detector 3 is applied to the control terminal 51 of the control switch 5 to close the switch 5. On the closure of the control switch 5, the other end of the capacitor 4 is connected to ground with the result that the capacitor 4 is added to the frequency control terminal 12 of the crystal oscillator circuit 1. The crystal oscillator circuit 1 has such a characteristic that the oscillation frequency thereof decreases when the capacitor 4 is added to the frequency control terminal 12 as mentioned above. The capacitance of the capacitor 4 is selected in such a manner as to provide the crystal oscillator device 10 with a required degree of stability by taking account of the source voltage dependency and additional capacitance dependency of the crystal oscillator circuit 1.

The second control signal from the source voltage detector 3 opens the control switch 5. In this condition, the other end of the capacitor 4 is not connected to ground so that the capacitor 4 is not added to the crystal oscillator circuit 1. As a result, the oscillation frequency of the circuit 1 is no compensated.

In the illustrative embodiment, the crystal oscillator device 10 is considered to be in a standard condition when the source voltage is low. In such a condition, the oscillation frequency of oscillator device 10 is not compensated. As the source voltage and, therefore, the oscillation frequency of crystal oscillator circuit 1 increases, the capacitor 4 is added to the frequency control terminal 12. This is successful in lowering the oscillation frequency of the circuit 1 by an amount corresponding to the change (increment) in the frequency ascribable to the change in the source voltage.

In FIG. 1, the oscillation frequency of crystal oscillator circuit 1 is assumed to increase with the increase in source voltage. Conversely, when the circuit 1 has such a characteristic that the oscillation frequency decreases with the increase in source voltage, the first and second control signals from the source voltage detector 3 each may be inverted in logical level so as to add the capacitor 4 when the source voltage is lower than the reference voltage.

To summarize the above-described operation, when the oscillation frequency of the crystal oscillator circuit 1 changes in response to a change in the source voltage, the source voltage detector 3 detects the change in source voltage and then outputs a control signal matching it. On receiving the control signal, the control switch 4 adds or does not add the frequency compensating capacitor 4 to the circuit 1. As a result, the change in the oscillation frequency of the crystal oscillation ascribable to the change in the source voltage is compensated for.

Figure 2:
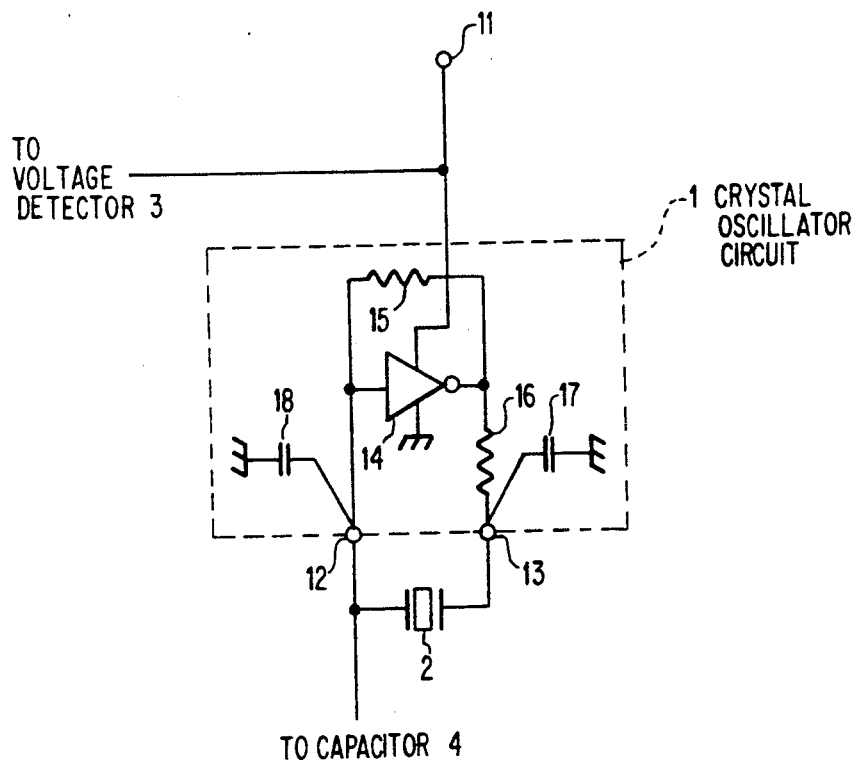
FIG. 2 is a circuit diagram showing a specific construction of a crystal oscillator circuit included in the embodiment.

FIG. 2 shows a specific construction of the crystal oscillator circuit 1. As shown, the circuit 1 has an inverter 14 which is an active circuit. A resistor 15 has high resistance and is connected between the input and output terminals of inverter 14 to define the bias voltage of inverter 14. The inverter 14 is operable in a linear range adjoining the defined bias point. The inverter 14 is connected between the source terminal 11 and ground and applied with the source voltage. A resistor 16 is connected at one end to the output terminal of the inverter 14 and at the other end to one end of the crystal 2 via the terminal 13, serving to adjust the drive current to be fed to the crystal 2. A capacitor 17 is connected between the terminal 13 and ground while a capacitor 18 is connected between the frequency control terminal 12 and ground. The frequency control terminal 12 is also connected to the input terminal of the inverter 14. The inverter 14 and resistors 15 and 16 may be included in a one-chip microprocessor or similar IC, as mentioned earlier.

The crystal oscillator circuit 1 is a Pierce nonadjustment oscillator circuit using the crystal 2 as an inductive reactance. The capacitors 17 and 18 constitute part of a tuning circuit of the crystal oscillator circuit 1 in cooperation with the crystal 2. The generated signal appears on the output of the inverter 14. The crystal oscillator circuit 1 changes the oscillation frequency thereof in response to a change in the source voltage being applied to the inverter 14 via the source terminal 11. More specifically, the oscillation frequency of the circuit 1 lowers as the source voltage lowers, and vice versa.

Figure 3:
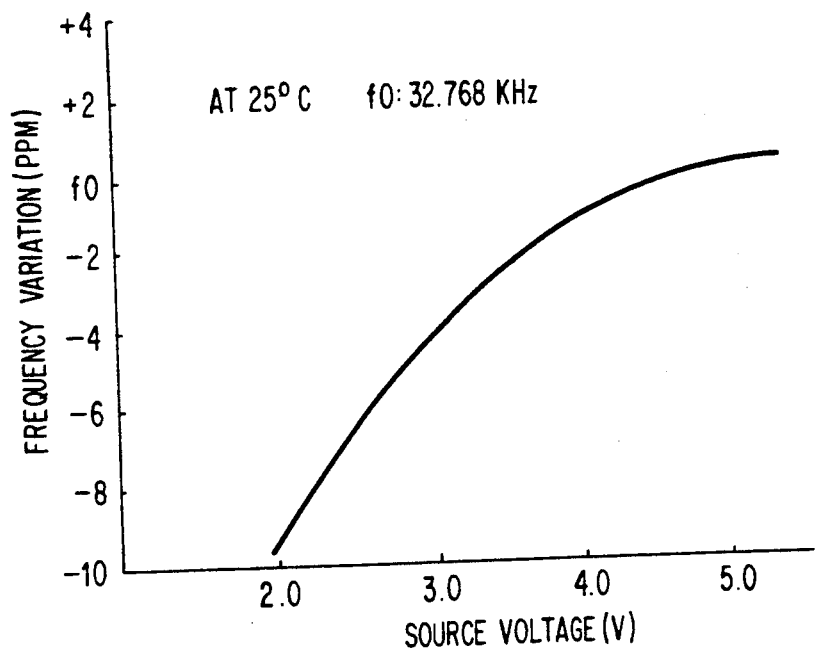
FIG. 3 is a graph indicating a specific voltage-to-frequency characteristic of the crystal oscillator circuit shown in FIG. 2.

The oscillation frequency of crystal oscillator circuit 1 shown in FIG. 2 has voltage dependency, as shown in FIG. 3. FIG. 3 shows a characteristic with respect to a one-chip microprocessor $\mu$PD75008 which includes the inverter 14 and resistors 15 and 16 of the circuit 1. The oscillation frequency of the circuit 1 is 32.768 kHz when the source voltage is 5 V. On the decrease in the source voltage to 3 V, the oscillation frequency is lowered by 4.5 PPM ($10^{-6}$). The characteristic shown in FIG. 3 was obtained with the capacitor 17 having a capacitance of 33 pF and the capacitor 18 having a capacitance of 22 pF, and at a temperature of 25° C.

Figure 4:
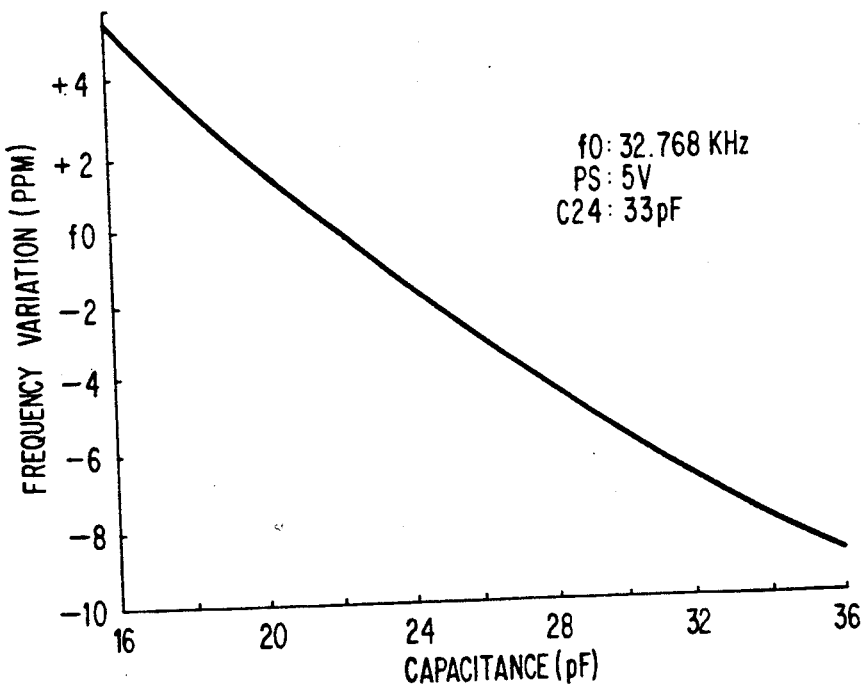
FIG. 4 is a graph showing a specific variation in oscillation frequency due to the addition of a frequency compensating capacitor to the circuit of FIG. 2.

FIG. 4 indicates how the oscillation frequency of crystal oscillator circuit 1 having the voltage-to-frequency characteristic of FIG. 3 changes in association with the capacitance of the capacitor 18 connected to the frequency control terminal 12. As the graph shows, when the source voltage applied to the circuit 1 is 5 V and the capacitance of the capacitor 18 is 22 pF, the circuit 1 oscillates at a frequency of 32.768 kHz. As the capacitance of the capacitor 18 decreases to 17 pF, the oscillation frequency of the circuit 1 increases by 4.55 PPM. Hence, assuming that the circuit 1 has the construction shown in FIG. 2, that the required oscillation frequency is 32.768 kHz, and that the source voltage of 3 V is standard, it is necessary, in the standard condition, to provide the capacitor 18 with a capacitance of 17 pF. When the source voltage is 5 V, the capacitance of the capacitor 18 has to be increased by 5 pF from the standard condition to 22 pF. In other words, the capacitor 4 in the circuitry of FIG. 1 needs a capacitance of 5 pF. Stated another way, if the capacitor 4 included in the embodiment of FIG. 1 is provided with a capacitance of 5 pF, the voltage dependency of the oscillation frequency of the crystal oscillator device 10 can be lowered to 1 PPM or less.

Figure 5:
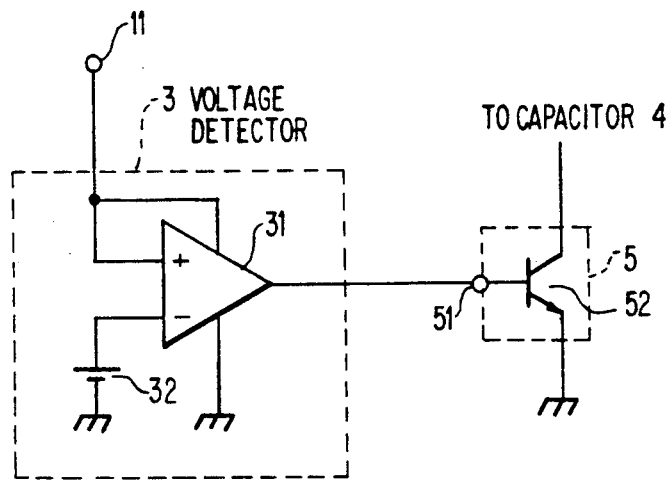
FIG. 5 is a circuit diagram showing specific constructions of a voltage detector and a control switch included in the embodiment.

Referring to FIG. 5, the specific constructions of the source voltage detector 3 and control switch 5, FIG. 1, are shown. The control switch 5 includes an NPN transistor 52. The NPN transistor 52 has a base serving as the control terminal 51 of the control switch 5 and an emitter which is connected to ground. The collector of the NPN transistor 51 is connected to the capacitor 4, FIG. 1. When the first control signal which is in a high level is applied to the base of the NPN transistor 52, i.e., the control terminal 51, the transistor 52 is turned on with the result that the other end of the capacitor 4 connected to the collector is connected to ground. Consequently, the capacitor 4 is added to the frequency control terminal 12 of the crystal oscillator circuit 1. Conversely, when the second control signal which is in a low level is fed to the base of the NPN transistor 52, the transistor 52 is turned off to prevent the capacitor 4 from being added to the frequency control terminal 12.

The source voltage detector 3 includes a comparator 31 which is implemented by an operational amplifier having non-inverting and inverting input terminals provided with the voltage appearing on the source terminal 11 and the reference voltage which is applied from a battery 32, respectively. The power source and one input to the comparator 61 are fed from the source terminal 11. The comparator 31 compares the voltages applied to the input terminals to produce a control signal. More specifically, assuming that the output voltage of the battery 32 is 4 V, the comparator 31 produces a (logical) ONE when the voltage on the source terminal 11 is 5 V. When the voltage on the source terminal 11 is 3 V, the comparator 31 produces a (logical) ZERO. In this manner, the source voltage detector 3 detects the source voltage of the crystal oscillator circuit 1 in terms of two levels by comparing it with the reference voltage from the cell 32, feeding the result of detection to the control terminal 51 of the control switch 5. When the inverted logical output of the source voltage detector 3 is needed, an inverter may be inserted between the output of the comparator 31 and the terminal 51. The comparator 31 will consume a minimum of current if implemented by a complementary metal oxide semiconductor (CMOS) circuit. Also, the service life of the battery 32 will be increased since it does not have to output a current.

Figure 6:
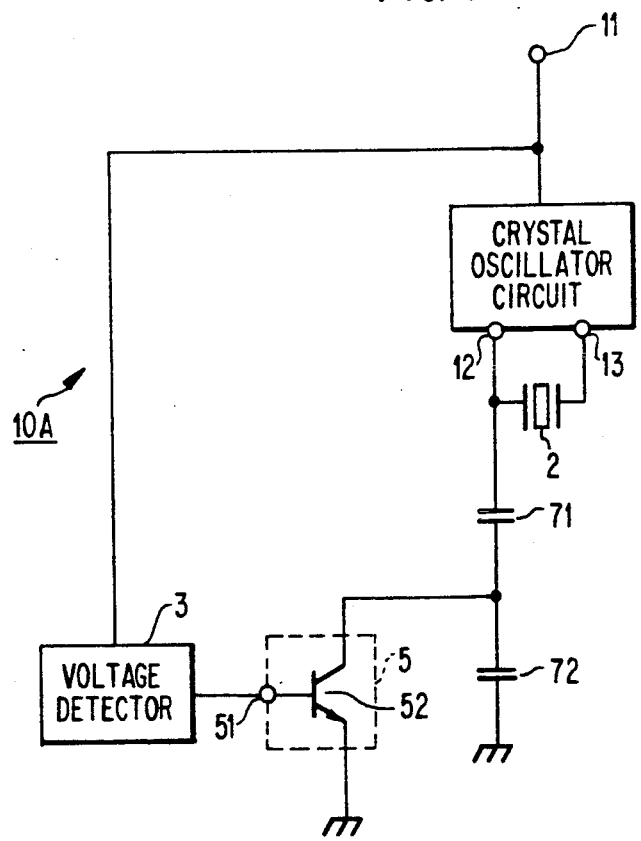
FIG. 6 is a circuit diagram representative of an alternative embodiment of the present invention.

Referring to FIG. 6, a crystal oscillator device 10A according to an alternative embodiment of the present invention is shown. The device 10A includes capacitors 71 and 72 in place of the capacitor 4, FIG. 1. The capacitor 71, like the capacitor 4, is connected between the frequency control terminal 12 and the collector of NPN transistor 52. The capacitor 72 is connected between the collector of NPN transistor 52 and ground. In this embodiment, when a high-level control signal is fed to the base of NPN transistor 52, i.e., the control terminal 51, opposite ends of the capacitor 72 are connected to ground. As a result, the capacitor 71 is added to the frequency control terminal 12 of crystal oscillator circuit 1 to change the oscillation frequency of the circuit 1. For example, when the circuit 1 is implemented by μPD75008, the oscillation frequency is lowered. When a low-level control signal is applied to the base of NPN transistor 52, the capacitor 72 is serially connected to the capacitor 71 to reduce the capacitance to be added to the frequency control terminal 12. Consequently, when use is made of μPD75008, a high-level control signal is applied to the control terminal 51 to increase the oscillation frequency.

It will be seen that when the crystal oscillator circuit 1 is of the type reducing the oscillation frequency thereof in response to an increase in source voltage, the circuitry shown in FIG. 6 is practicable with the first control signal which turns on the control switch 5 when the source voltage is high, as in the embodiment of FIG. 1, i.e., the alternative embodiment does not have to be supplied with an inverted logical level.

What is claimed is:

1. A crystal oscillator device comprising:
   crystal oscillator circuit means which has a frequency control terminal and whose oscillation frequency depends on a source voltage applied thereto and on a capacitance added to said frequency control terminal;
   a capacitor having a predetermined value of capacitance;
   voltage detector means for comparing said source voltage with a predetermined reference voltage and producing a control signal matching a result of comparison; and
   control switch means responsive to said control signal for selectively coupling said capacitor to said frequency control terminal to compensate for a change in said oscillation frequency.

2. A crystal oscillator device as claimed in claim 1 wherein said crystal oscillator circuit means comprises means for raising said oscillation frequency as said source voltage increases and means for lowering said oscillation frequency when a capacitance is added to said frequency control terminal,
   and wherein said voltage detector means comprises means for producing a first control signal when said source voltage is higher than said reference voltage and producing a second control signal when said source voltage is lower than said reference voltage;
   and wherein said control switch means comprises means for coupling said capacitor to said frequency control terminal in response to said first control signal and decoupling said capacitor from said frequency control terminal in response to said second control signal.

3. A crystal oscillator device as claimed in claim 1, wherein said crystal oscillator circuit means comprises means for raising said oscillation frequency as said source voltage increases and means for increasing said oscillation frequency when said capacitance is added to said frequency control terminal,
   and wherein said voltage detector means comprises means for producing a first control signal when said source voltage is higher than said reference voltage and producing a second control signal when said source voltage is lower than said reference voltage;
   and wherein said control switch means comprises means for decoupling said capacitor from said frequency control terminal in response to said first control signal and coupling said capacitor to said frequency control terminal in response to said second control signal.

4. A crystal oscillator device as claimed in claim 1, wherein said control switch means comprises an NPN transistor having a collector connected to said capacitor, an emitter connected to ground and a base connected to the output of said voltage detector means.

5. A crystal oscillator device as claimed in claim 1, wherein said voltage detector means comprises comparator means having two inputs provided with said source and reference voltages, respectively, and an output connected to the input of said control switch means.

6. A crystal oscillator device comprising:
crystal oscillator circuit means which has a frequency control terminal and whose oscillation frequency depends on a source voltage applied thereto and on a capacitance added to said frequency control terminal;
first capacitor means having a first predetermined value of capacitance and connected at one end to said frequency control terminal;
voltage detector means for comparing said source voltage with a predetermined reference voltage and producing a control signal depending on the comparison result;
second capacitor means having a second predetermined value of capacitance and connected at one end to the other end of said first capacitor and at the other end to ground; and
control switch means responsive to said control signal for selectively connecting the other end of said first capacitor to ground to compensate for a change in said oscillation frequency.

7. A crystal oscillator as claimed in claim 6, wherein said control switch means comprises an NPN transistor having a collector connected to the other end of said first capacitor, an emitter connected to ground, and a base connected to the output of said voltage detector.

8. A crystal oscillator device as claimed in claim 6, wherein said voltage detector means comprises comparator means having two inputs provided with said source and reference voltages, respectively, and an output connected to the input of said control switch means.

9. A crystal oscillator device as claimed in claim 6, wherein said crystal oscillator circuit means comprises means for raising said oscillation frequency as said source voltage increases and means for lowering said oscillation frequency when a capacitance is added to said frequency control terminal,
and wherein said voltage detector means comprises means for producing a first control signal when said source voltage is higher than said reference voltage and producing a second control signal when said source voltage is lower than said reference voltage;
and wherein said control switch means comprises means for coupling said capacitor to said frequency control terminal in response to said first control signal and decoupling said capacitor from said frequency control terminal in response to said second control signal.

10. A crystal oscillator device as claimed in claim 6, wherein said crystal oscillator circuit comprises means for raising said oscillation frequency as said source voltage increases and means for increasing said oscillation frequency when said capacitance is added to said frequency control terminal,
and wherein said voltage detector means comprises means for producing a first control signal when said source voltage is higher than said reference voltage and producing a second control signal when said source voltage is lower than said reference voltage;
and wherein said control switch means comprises means for decoupling said capacitor from said frequency control terminal in response to said first control signal and coupling said capacitor to said frequency control terminal in response to said second control signal.

11. A crystal oscillator device comprising:
crystal oscillator circuit means having a frequency control terminal and whose oscillation frequency varies in response to a change in source voltage applied thereto and addition of a capacitance to said frequency control terminal;
a first capacitor connected at one end to said frequency control terminal;
source voltage detector means for comparing said source voltage with a predetermined reference voltage and producing a first control signal when said source voltage is higher than said reference voltage and producing a second control signal when said source voltage is lower than said reference voltage;
a second capacitor connected at one end to the other end of said first capacitor and at the other end to ground; and
control switch means for selectively connecting the other end of said first capacitor to ground in response to one of said first and second control signal so that a change in said oscillation frequency may be compensated for.

12. A crystal oscillator device as claimed in claim 11, wherein said control switch means comprises an NPN transistor having a collector connected to the other end of said first capacitor, an emitter connected to ground, and a base connected to the output of said voltage detector means.

13. A crystal oscillator as claimed in claim 11, wherein said crystal oscillator circuit means comprises means for lowering said oscillation frequency as said source voltage increases and means for increasing said oscillation frequency when a capacitance is added to said frequency control terminal,
and wherein said control switch means comprises means for decoupling the other end of said first capacitor from ground in response to said first control signal and means for coupling the other end of said first capacitor to ground in response to said second control signal.

14. A crystal oscillator device as claimed in claim 11, wherein said crystal oscillator circuit means comprising means for lowering said oscillation frequency as said source voltage increases and means for lowering said oscillation frequency when a capacitance is added to said frequency control terminal,
and wherein said control switch means comprising means for decoupling the other end of said first capacitor from ground in response to said first control signal and means for coupling the other end of said first capacitor to ground in response to said second control signal.

15. A device comprising:
oscillator means for generating a signal having a predetermined oscillation frequency;
source voltage means for applying a source voltage to said oscillator means, said oscillation frequency varying with said source voltage;

capacitor means having predetermined capacitance to be added to said oscillator means to compensate for a change in said oscillation frequency which is caused by a change in said source voltage; and control means for selectively adding said capacitance to said oscillator means in response to a change in said source voltage.

16. A device as claimed in claim 15, wherein said control means comprises:

voltage detector means for detecting a change in said source voltage to produce a control signal; and control switch means responsive to said control signal for selectively adding said capacitance to said oscillator means.

17. A device as claimed in claim 16, wherein said oscillator means comprises means for increasing said oscillation frequency as said source voltage increases and means for increasing said oscillation frequency when said capacitance is added to said oscillator means, and wherein said voltage detector means comprises means for comparing said source voltage with a predetermined reference voltage and producing first and second control signals when said source voltage is higher and lower than said reference voltage, respectively, and wherein said control switch means comprises means for disconnecting said capacitance from said oscillator means in response to said first control signal and means for connecting said capacitance to said oscillator means in response to said second control signal.

18. A device as claimed in claim 15, wherein said oscillator means comprises a crystal.

19. A device as claimed in claim 17, wherein said voltage detector means comprises a operational amplifier having non-inverting and inverting inputs which are provided with said source and reference voltages, respectively, and an output connected to the output of said voltage detector means.

20. A device as claimed in claim 17, wherein said control switch means comprises an NPN transistor having a base connected to the output of said voltage detector means, an emitter connected to ground and a collector connected to said capacitor means.

21. A device as claimed in claim 16, wherein said capacitor means comprises a capacitor connected between said oscillator means and said control switch means.

22. A device as claimed in claim 16, wherein said capacitor means comprises first and second capacitors connected in series between said oscillator means and ground, the junction of said first and second capacitors being connected to the output of said control switch means.

23. A method of controlling the oscillation frequency of an oscillator circuit, comprising the following steps of:

detecting a voltage change in a source voltage applied to said oscillator circuit to produce a control signal; and responsive to said control signal, adding capacitance to said oscillator circuit so that a frequency change in said oscillation frequency which frequency change is caused by said voltage change may be compensated for.

* * * * *